United States Patent
Dent

(10) Patent No.: US 6,889,034 B1
(45) Date of Patent: May 3, 2005

(54) ANTENNA COUPLING SYSTEMS AND METHODS FOR TRANSMITTERS

(75) Inventor: Paul Wilkinson Dent, Pittsboro, NC (US)

(73) Assignee: Ericsson Inc., Research Triangle Park, NC (US)

( * ) Notice: Subject to any disclaimer, the term of this patent is extended or adjusted under 35 U.S.C. 154(b) by 0 days.

(21) Appl. No.: 09/461,671

(22) Filed: Dec. 14, 1999

Related U.S. Application Data

(63) Continuation-in-part of application No. 09/209,104, filed on Dec. 10, 1998, now Pat. No. 6,311,046, which is a continuation-in-part of application No. 09/361,080, filed on Jul. 26, 1999, now Pat. No. 6,097,615, which is a continuation-in-part of application No. 09/054,063, filed on Apr. 2, 1998, now Pat. No. 6,133,788, which is a continuation of application No. 09/054,060, filed on Apr. 2, 1998, now Pat. No. 5,930,128.

(51) Int. Cl.[7] ............................. H04B 1/02; H04B 1/44; H01Q 11/12
(52) U.S. Cl. ....................... 455/102; 455/103; 455/121; 455/82
(58) Field of Search ................................. 455/102, 113, 455/121, 129, 82, 83, 79, 103, 19, 21

(56) References Cited

U.S. PATENT DOCUMENTS

| | | |
|---|---|---|
| 2,210,028 A | 8/1940 | Doherty |
| 3,777,275 A | 12/1973 | Cox ............................. 330/10 |
| 3,805,139 A | 4/1974 | Hoffman, Jr. et al. ........... 321/5 |

(Continued)

FOREIGN PATENT DOCUMENTS

| | | |
|---|---|---|
| EP | 0 471 346 A1 | 2/1992 |
| EP | 0 725 478 A1 | 8/1996 |
| GB | 2 267 402 A | 12/1993 |

OTHER PUBLICATIONS

PCT/US01/24041, Invitation to Pay Additional Fees (date of mailing: Feb. 10, 2003).
International Search Report, PTO/US99/05681, Jul. 6, 1999.
Chireix, *High Power Outphasing Modulation*, Proceedings of the Institute of Radio Engineers, vol. 23, No. 11, Nov. 1935, pp. 1370–1392.

*Primary Examiner*—David Hudspeth
*Assistant Examiner*—S. Smith
(74) *Attorney, Agent, or Firm*—Myers Bigel Sibley & Sajovec

(57) ABSTRACT

Multiple radio channel frequency signals that are modulated with respective information modulation are transmitted from a common antenna at multiple radio frequencies. Multiple modulators are provided, a respective one of which corresponds to a respective one of the radio channel frequencies. Each modulator generates at least one constant amplitude, phase modulated drive signal at the corresponding radio channel frequency from the respective information modulation, such that the at least one constant amplitude, phase modulated drive signal corresponds to the information modulation for the corresponding radio frequency. At least one saturated power amplifier is provided for each of the at least one constant amplitude, phase modulated drive signals. A respective saturated power amplifier is responsive to the corresponding constant amplitude, phase modulated drive signal, to produce a corresponding amplified output signal at an output thereof. A coupling network connects the outputs of the saturated power amplifiers in series, to produce a combined signal that is applied to the common antenna, such that the common antenna radiates the radio channel frequency signals that are modulated with the respective information modulation. In first embodiments, the at least one constant amplitude, phase modulated drive signal is a single constant envelope modulation drive signal, wherein the information modulation is a constant envelope information modulation. In other embodiments, at least two constant amplitude phase modulated drive signals are provided at the corresponding radio channel frequency, such that the at least two constant amplitude, phase modulated drive signals correspond to the information modulation for the corresponding radio frequency.

50 Claims, 9 Drawing Sheets

U.S. PATENT DOCUMENTS

| | | | |
|---|---|---|---|
| 3,886,452 A | 5/1975 | Seidel | 325/11 |
| 3,906,401 A | 9/1975 | Seidel | 332/18 |
| 3,909,742 A | 9/1975 | Cox et al. | 330/84 |
| 3,927,379 A | 12/1975 | Cox et al. | 330/10 |
| 4,090,147 A | 5/1978 | Seidel | 330/10 |
| 4,178,557 A | 12/1979 | Henry | 330/10 |
| 4,315,107 A | 2/1982 | Ciesielka et al. | 179/16 F |
| 4,420,723 A | 12/1983 | de Jager | 330/10 |
| 4,433,312 A | 2/1984 | Kahn | 332/22 |
| 4,485,357 A | 11/1984 | Voorman | 332/17 |
| 4,580,111 A | 4/1986 | Swanson | 332/41 |
| 5,086,450 A | 2/1992 | Kitagawa et al. | 379/40 |
| 5,249,201 A * | 9/1993 | Posner et al. | 375/295 |
| 5,305,384 A * | 4/1994 | Ashby et al. | 380/29 |
| 5,329,245 A | 7/1994 | Hammond et al. | 330/251 |
| 5,365,187 A * | 11/1994 | Hornak et al. | 330/10 |
| 5,420,541 A | 5/1995 | Upton et al. | 330/286 |
| 5,453,717 A | 9/1995 | Gerfault | 330/146 |
| 5,499,389 A * | 3/1996 | Victorin | 455/119 |
| 5,568,088 A * | 10/1996 | Dent et al. | 330/151 |
| 5,574,967 A | 11/1996 | Dent et al. | 455/12.1 |
| 5,584,057 A * | 12/1996 | Dent | 455/101 |
| 5,631,604 A | 5/1997 | Dent et al. | 330/124 R |
| 5,638,024 A | 6/1997 | Dent et al. | 330/84 |
| 5,638,401 A * | 6/1997 | Jones | 375/298 |
| 5,659,886 A * | 8/1997 | Taira et al. | 333/126 |
| 5,734,565 A | 3/1998 | Mueller et al. | 363/132 |
| 5,815,531 A | 9/1998 | Dent | 375/298 |
| 5,933,766 A * | 8/1999 | Dent | 455/103 |
| 5,959,984 A * | 9/1999 | Dent | 370/294 |
| 5,974,101 A * | 10/1999 | Nago | 375/148 |
| 6,097,252 A | 8/2000 | Sigmon et al. | 330/136 |
| 6,415,001 B1 * | 7/2002 | Li et al. | 375/219 |
| 2002/0058490 A1 * | 5/2002 | Sorrells et al. | 455/313 |

\* cited by examiner

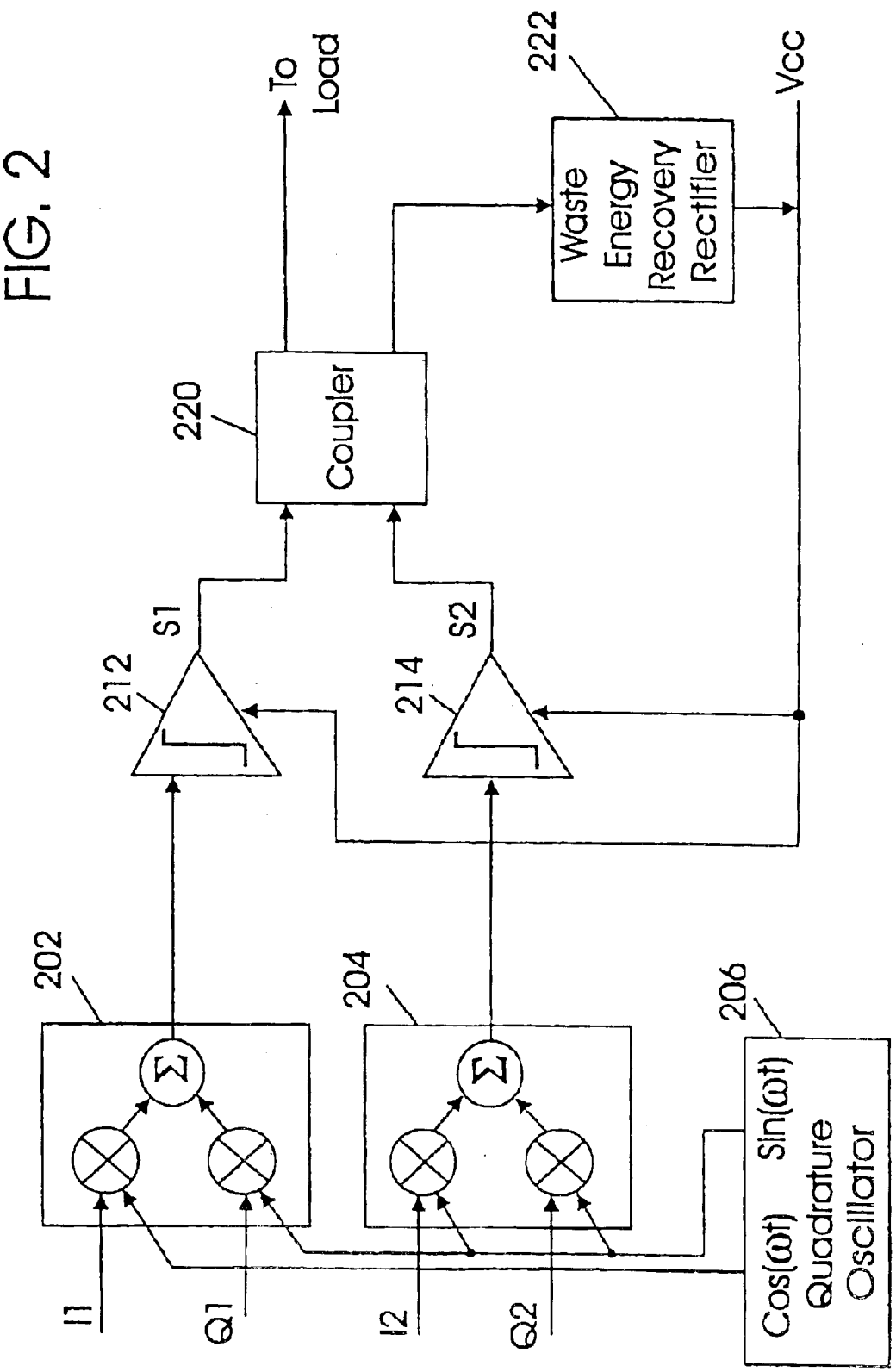

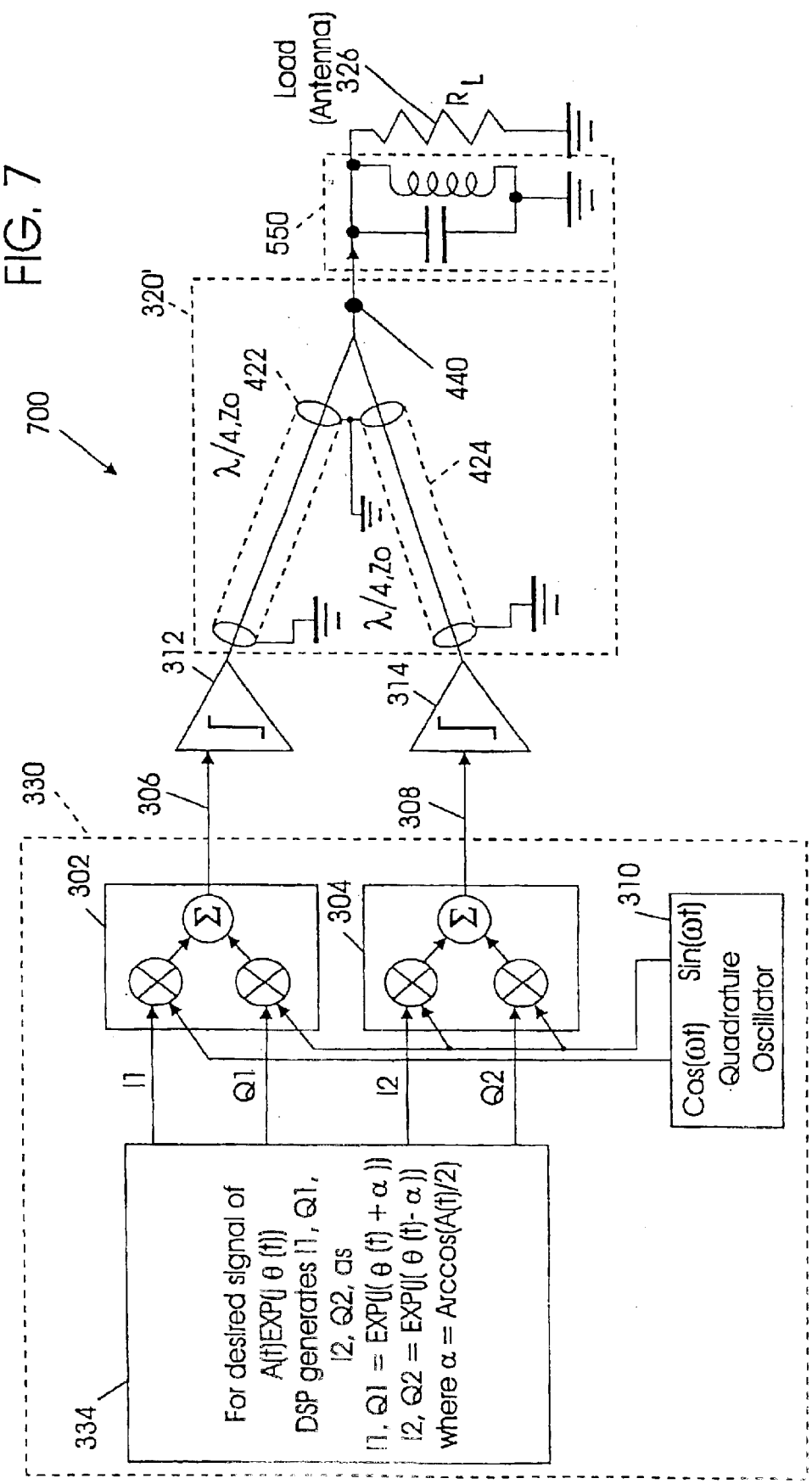

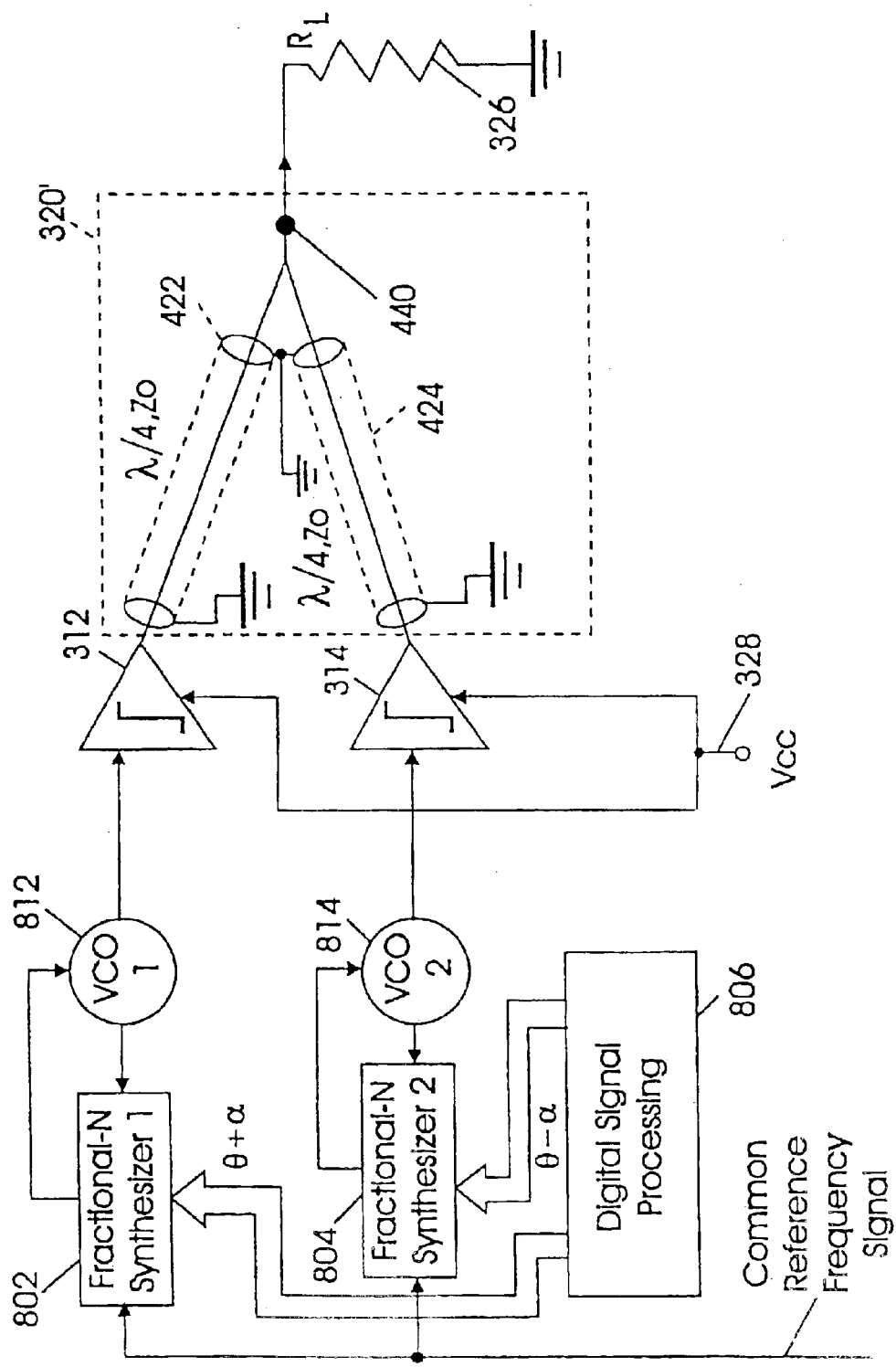

US 6,889,034 B1

ANTENNA COUPLING SYSTEMS AND METHODS FOR TRANSMITTERS

CROSS REFERENCE TO RELATED APPLICATIONS

This application is a Continuation-in-Part (CIP) of application Ser. No. 09/209,104, filed Dec. 10, 1998 now U.S. Pat. No. 6,311,046, entitled "Linear Amplification Systems and Methods Using More Than Two Constant Length Vectors" to the present inventor, assigned to the assignee of the present invention, which itself is a CIP of application Ser. No. 09/054,063, filed Apr. 2, 1998 now U.S. Pat. No. 6,133,788, entitled "Hybrid Chireix/Doherty Amplifiers and Methods" to the present inventor, assigned to the assignee of the present invention. This application also is a CIP of application Ser. No. 09/361,080, filed Jul. 26, 1999 now U.S. Pat. No. 6,097,615, entitled "Power Waveform Synthesis Using Bilateral Devices" to the present inventor, assigned to the assignee of the present invention, which itself is a continuation of application Ser. No. 09/054,060 filed Apr. 2, 1998 of the same title, now U.S. Pat. No. 5,930,128. The disclosures of all these prior applications are hereby incorporated herein by reference in their entirety.

BACKGROUND OF THE INVENTION

This invention relates to transmitters and transmitting methods, and more particularly to transmitters and transmitting methods that can transmit multiple radio frequencies.

Transmitters are widely used to transmit radio frequency communications. In particular, in radiotelephone base stations, a transmitter generally transmits a plurality of radio frequencies from a common antenna. At each radio frequency, a radio channel frequency signal that is modulated with information modulation is transmitted.

Unfortunately, it may be difficult to couple a plurality of a radio channel frequency signals to a common antenna without appreciable loss. In particular, the radio channel frequency signals generally are amplified by a respective plurality of power amplifiers, and it may be difficult to couple the outputs of the power amplifiers to a common antenna without appreciable loss. Frequency selective combiners previously have been used to couple adjacent channel amplifiers to the common antenna. Unfortunately, these combiners may waste significant energy as heat, and/or may not be selective enough to allow adjacent channels to be combined unless they use cooled, superconductive resonators.

SUMMARY OF THE INVENTION

The present invention can provide transmitters and transmitting methods that transmit from a common antenna at a plurality of radio frequencies, a plurality of radio channel frequency signals that are modulated with respective information modulation. A plurality of modulators are provided, a respective one of which corresponds to a respective one of the plurality of radio channel frequencies. Each modulator generates at least one constant amplitude, phase modulated drive signal at the corresponding radio channel frequency from the respective information modulation, such that the at least one constant amplitude, phase modulated drive signal corresponds to the information modulation for the corresponding radio frequency. At least one saturated power amplifier is provided for each of the at least one constant amplitude, phase modulated drive signals. A respective saturated power amplifier is responsive to the corresponding constant amplitude, phase modulated drive signal, to produce a corresponding amplified output signal at an output thereof. A coupling network connects the outputs of the saturated power amplifiers in series, to produce a combined signal that is applied to the common antenna, such that the common antenna radiates the plurality of radio channel frequency signals that are modulated with the respective information modulation.

In first embodiments, the at least one constant amplitude, phase modulated drive signal is a single constant envelope modulation drive signal, wherein the information modulation is a constant envelope information modulation. Frequency and/or phase modulation of analog voice modulation and/or digital data modulation may be provided. The analog voice modulation may be analog Frequency Modulation (FM) and the digital data modulation may be Continuous Phase Modulation (CPM) and/or Gaussian Minimum Shift Keying (GMSK). The analog FM may conform to the AMPS cellular radiotelephone standard, and the GMSK may conform to the GSM cellular radiotelephone standard.

In other embodiments, at least two constant amplitude phase modulated drive signals are provided at the corresponding radio channel frequency, such that the at least two constant amplitude, phase modulated drive signals correspond to the information modulation for the corresponding radio frequency. Again, the information modulation may be analog voice modulation and/or digital data modulation. The digital data modulation preferably is 8-Phase Shift Keying (PSK) and π/4 Differential Quadrature Phase Shift Keying (DQPSK). The DQPSK may conform to the IS136 and or DAMPS cellular radiotelephone standards.

In all of the above embodiments, the coupling network preferably comprises a plurality of transformers, each having a primary and a secondary. A respective primary is coupled to a respective output of a respective saturated power amplifier. The secondaries are serially coupled to the common antenna. Alternatively, the coupling network may comprise a plurality of quarter wavelength transmission lines, each having first and second ends. A respective first end is coupled to a respective output of a respective saturated power amplifier. The second ends are coupled together to the common antenna. In yet another alternative, the coupling network may comprise a plurality of discrete inductance-capacitance equivalents of quarter wavelength transmission lines, each having first and second ends. A respective first end is coupled to a respective output of a respective saturated amplifier. The second ends are coupled together to the common antenna. The discrete inductance-capacitance equivalents may be provided by an inductor that is connected between a respective output of a respective saturated power amplifier and the common antenna, and a capacitor connected to the common antenna, to thereby form a π circuit with the output capacitance of the saturated power amplifiers.

The saturated power amplifiers preferably each include bilateral amplifier devices that draw current from a DC power supply and supply current to the DC power supply during operation. The bilateral amplifier devices may comprise field effect transistors that conduct from source to drain and from drain to source and/or bipolar transistors including reverse conduction diodes that conduct in a forward direction through the bipolar transistors and in a reverse direction through the reverse conduction diodes. The transmitter may be combined with a common antenna to provide a radiotelephone base station. The radiotelephone base station can transmit adjacent frequency channels, such as AMPS channels that are spaced only 30 kHz apart, which may have been difficult using conventional transmitters. Related methods also may be provided.

BRIEF DESCRIPTION OF THE DRAWINGS

FIG. 2 is a block diagram of a conventional power amplifier using quadrature modulators and a pair of isolated power amplifiers.

FIG. 7 is a block diagram of a fourth embodiment of power amplifiers according to the parent applications.

FIG. 8 is a block diagram of a fifth embodiment of power amplifiers according to the parent applications.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. It will be understood that when an element is referred to as being "connected" or "coupled" to another element, it can be directly connected or coupled to the other element or intervening elements may be present. In contrast, when an element is referred to as being "directly connected" or "directly coupled" to another element, there are not intervening elements present. Moreover, each embodiment described and illustrated herein includes its complementary conductivity type embodiment as well.

Prior to describing the present invention, amplification systems and methods according to the parent applications will be described. Then, antenna coupling systems and methods for transmitters according to the present application will be described in detail.

Linear Amplification Systems and Methods

Figure 1:
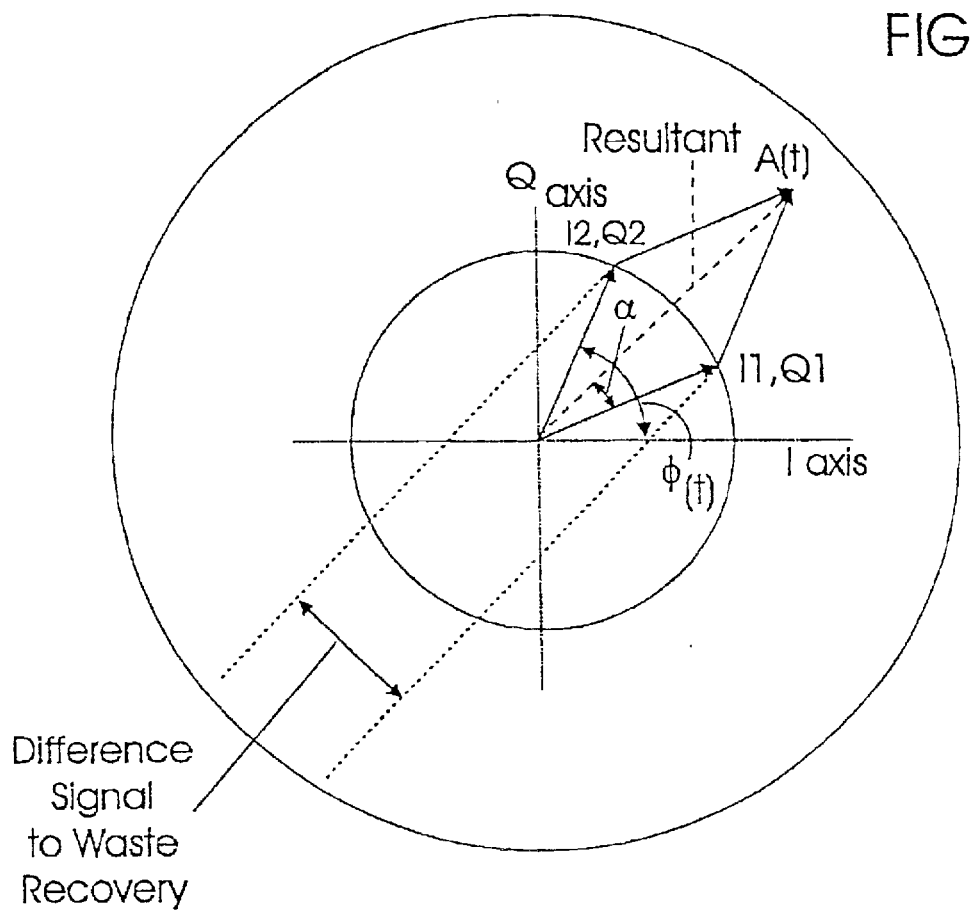
FIG. 1 graphically illustrates vector addition of two constant envelope signals.

FIG. 1 shows how a varying amplitude vector can be constructed by adding two constant amplitude vectors with correct relative phasing, as first proposed by Chireix in his 1935 paper entitled *High Power Outphasing Modulation*, Proc. IRE, Vol. 23, No. 11 (1935), pp. 1370–1392. The inner circle indicates maximum amplitude for one power amplifier, and the outer circle indicates maximum amplitude for two equal power amplifiers. As shown, the desired amplitude is $A(t)$ and the desired phase is $\phi(t)$. This may be obtained using first in-phase and quadrature signals I1 and Q1 and second in-phase and quadrature signals I2 and Q2, where I1=COS($\phi-\alpha$), Q1=SIN($\phi-\alpha$), I2=COS($\phi+\alpha$), and Q2=($\phi+\alpha$), where $\alpha$=arcos(A/2).

In that era, Chireix did not have the benefit of modern digital signal processing technology to accurately generate the two out-phased signals. A modern implementation using two quadrature modulators 202, 204 driven by digitally synthesized vector waveforms I1, Q1, I2, Q2 and a quadrature oscillator 206 is shown in FIG. 2.

The output of the two power amplifiers 212, 214 each being for example, a class-C amplifier of power Pmax/2, can be added using a hybrid or −3 dB directional coupler 220 (coupling factor "k"=0.7071). A hybrid or directional coupler 220 effectively produces a sum and difference signal. Terminating the difference port and the sum port with like impedances gives isolation between the two power amplifiers so that power (voltage or current) from one does not reach the other. The sum signal rises to Pmax when both amplifiers are driven in phase, and falls to zero when they are driven 180 degrees out of phase. In between, the power is Pmax·cos²$(\alpha)$ where '$\alpha$' is the relative phasing. The difference output is Pmax·sin²$(\alpha)$ and the sum of the outputs thus is Pmax.

When the desired output P(t) is less than Pmax, the difference Pmax−P(t) comes out the difference port and normally is lost. The average efficiency in this case may be even worse than the theoretical value for class-B of $\pi/4$ or 78.5%, as the battery current does not reduce when the output is less than Pmax. On the other hand, there is a possibility that constant envelope amplifiers can be constructed in practice with higher efficiency (at Pmax) than amplifiers with a linearity requirement, so that in practice an advantage may be obtained. However, even if a class-C efficiency of 100% could be obtained, the arrangement might only give 500/% efficiency with a peak-to-mean power ratio of 3 dB, and 25% with a peak-to-mean ratio of 6 dB.

To help the efficiency, the present inventor proposed, in U.S. Pat. Nos. 5,568,088; 5,574,967; 5,631,604; and 5,638,024, all entitled Waste Energy Control and Management in Power Amplifiers, to recover the energy normally dissipated at the difference port of the output coupler. A waste energy recovery rectifier 222 is used to rectify the dissipated energy and feed the DC current back to the battery. It is known that very efficient rectifiers can be made even at microwave frequencies, as research on wireless power transmission using microwaves has demonstrated.

For digital modulation signals, it is known that the number of different I and Q waveforms that are needed over a data bit interval can be limited to two to the power of a small number of bits surrounding the current bit, because data bits further removed from a current data bit have negligible effect. Thus the waveforms I1, Q1, I2 and Q2 may be precomputed for all two to the power N combinations of nearby bits and stored in memory, and recalled when needed. In that way, the need to compute arc-cosines in real time may be avoided.

Figure 3:
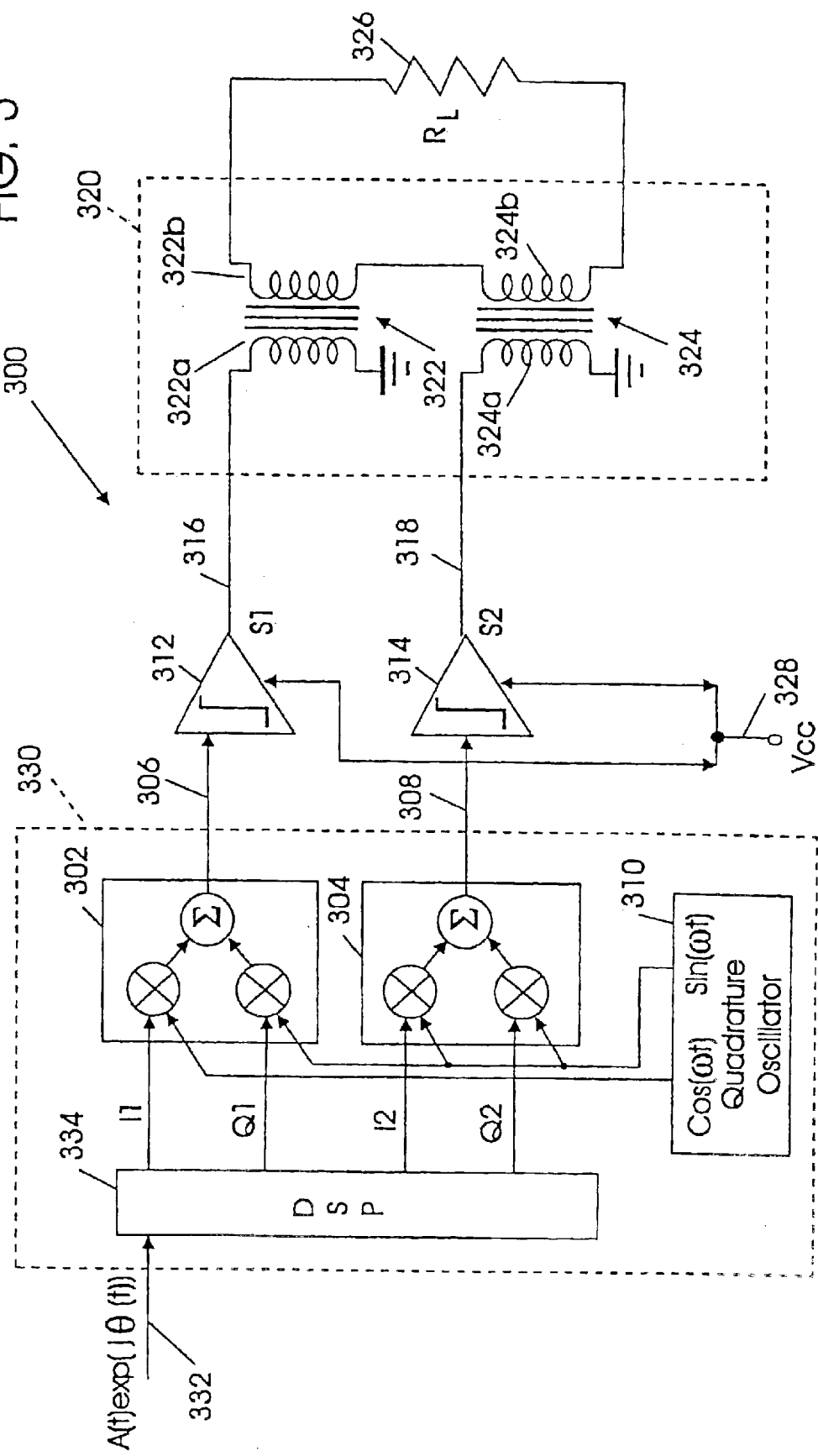
FIG. 3 is a block diagram of a first embodiment of power amplifiers according to the parent applications.

Referring now to FIG. 3, a power amplifier 300 according to the parent applications is described. Power amplifier 300 amplifies an AC input signal 332 of varying amplitude and varying phase to produce an amplified output signal voltage and an output current in a load impedance $R_L$ 326 using a DC power supply VCC 328. It will be understood that the load impedance 326 may be an antenna and the DC power supply 328 may be a battery.

Still referring to FIG. 3, the power amplifier 300 includes converting means 330 for converting the AC input signal 332 into a first signal 306 having constant amplitude and a first phase angle and into a second signal 308 having constant amplitude and a second phase angle. Converting means 330 may be formed by a digital signal processor (DSP) 334 that generates I1, Q1, I2 and Q2 signals. First and second quadrature modulators 302, 304 respectively, are responsive to a quadrature oscillator 310 and to the in-phase and quadrature signals I1, Q1, I2, Q2 to produce the first signal 306 and second signal 308. The design and operation of converting means 330, and the individual components thereof, are well known to those having skill in the art and need not be described further herein.

Still referring to FIG. 3, a first amplifier 312 amplifies the first signal 306, to produce a first output signal voltage S1 (316) of constant voltage amplitude. As will be described in detail below, the first amplifier 312 preferably includes bilateral amplifier devices that draw current from the DC power supply, but that also supply current to the DC power supply. Accordingly, the connection between first amplifier 312 and DC power supply 328 is shown to be bidirectional.

Still referring to FIG. 3, a second amplifier 314 amplifies the second signal 308 to produce a second output signal voltage of constant voltage amplitude S2 (318). As was described above, the second amplifier 314 also preferably includes bilateral amplifier devices that draw current from the DC power supply and supply current to the DC power supply. Amplifiers 312 and 314 may be class-C power amplifiers, although other classes of power amplifiers may also be used.

Still referring to FIG. 3, a coupler 320 couples the first and second amplifiers 312 and 314 to each other and to the load impedance 326 such that the voltage or current in the first amplifier become linearly related to the voltage or current in the second amplifier. Coupler 320 may be contrasted from a directional coupler that was used in a conventional Chireix circuit. In particular, the coupler 320 does not isolate the first and second amplifiers from one another. Rather, it interactively couples the first and second amplifiers to one another, so that each affects the other's load line.

In FIG. 3, the coupler 320 comprises a first transformer 322 and a second transformer 324. Their respective secondaries 322b and 324b are series-coupled across a load impedance 326. Their respective primaries 322a and 324a are coupled to the outputs 316 and 318 of first and second amplifiers 312 and 314 respectively. Accordingly, the sum of the first and second output signal voltages S1 and S2 produces the amplified output signal voltage across the load impedance 326 and also produces the output current through the load impedance. An amplifier current that is linearly related to the output current flows in the bilateral amplifier devices of both the first and second amplifiers 312 and 314.

The transformers 322 and 324 facilitate the series coupling of outputs that are relative to ground. The series coupling can ensure that the same current, equal to the load current or a scaled value thereof, flows in the output circuits of both amplifiers 312 and 314.

By omitting the output coupler of FIG. 2, which isolated the two amplifiers from each other, the amplifiers are now allowed to affect or interact with each other. In particular, when the two amplifiers are driven out of phase so that output signal S1 equals −S2, the sum of their outputs into load impedance RL will be zero and there will be no load current. Therefore, the current flowing in the amplifier devices will also be zero due to the series connection, which ensures that both amplifier currents and the load current are the same. If no current flows in the amplifier devices, the current consumed from the DC supply voltage Vcc also will be zero. Thus in contrast to the coupled power amplifiers of FIG. 2, which consume a constant amount of power from the supply even when the instantaneous load power is zero, the arrangement of FIG. 3 can reduce its current consumption as the instantaneous output power is reduced.

Figure 4:
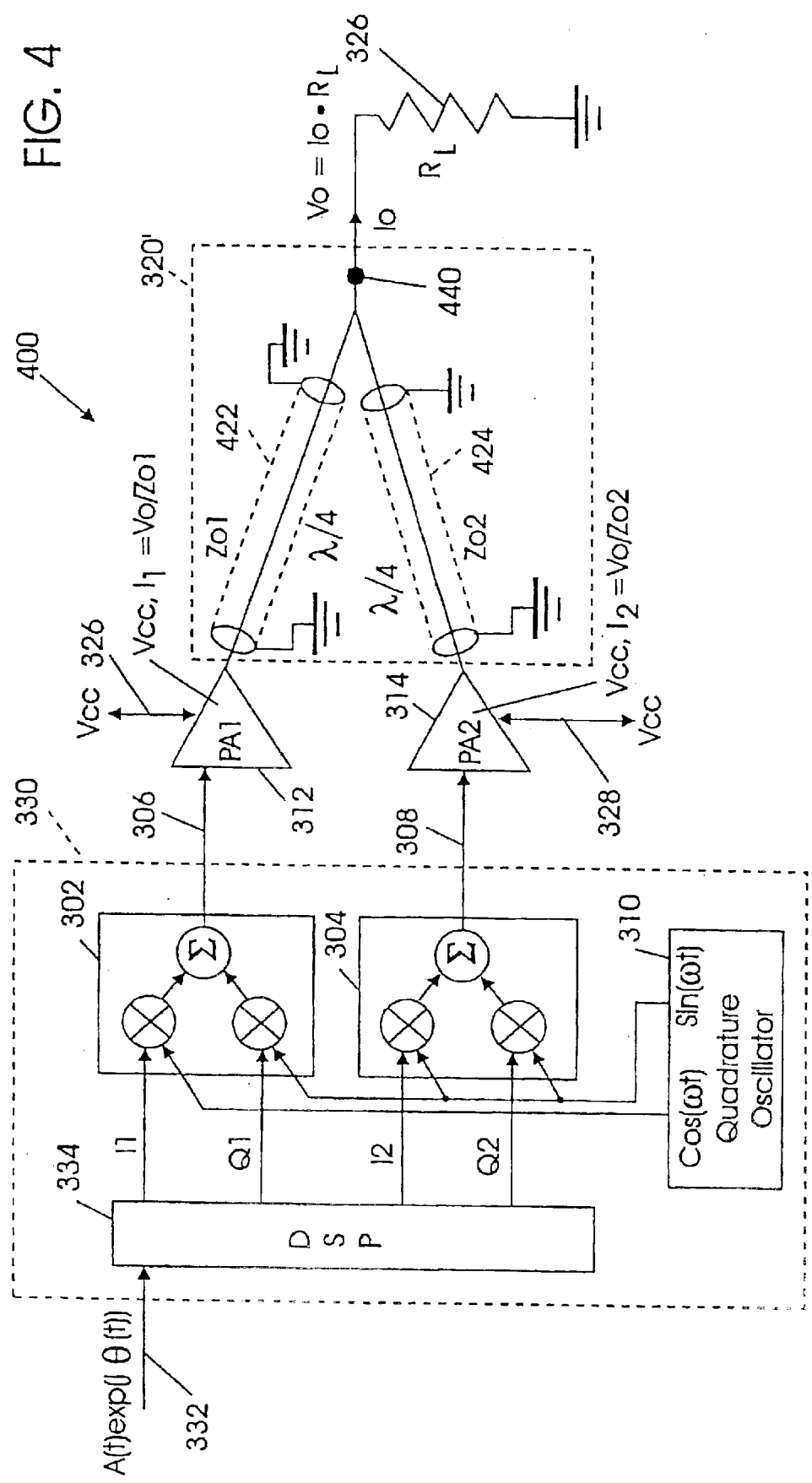
FIG. 4 is a block diagram of a second embodiment of power amplifiers according to the parent applications.

Referring now to FIG. 4, a second embodiment of power amplifiers according to the parent application is shown. As shown in FIG. 4, power amplifier 400 is similar to power amplifier 300 of FIG. 3. However, the interactive coupler 320' that couples the first and second amplifiers 312 and 314 to the load impedance 326 is embodied by first and second quarter wavelength transmission lines 422 and 424 respectively. The load impedance includes an input node 440, and the first and second quarter wavelength transmission lines 422 and 424 are preferably coupled to the input node 440.

As illustrated in FIG. 4, series connection at microwave frequencies may be more practically achieved by parallel connection a quarter wave distant, using the two quarter wave lines 422 and 424. When the outputs of the two quarter wave lines are paralleled, the output voltages are forced to be the same (Vo) at the input node 440.

This forces the currents to be the same quarter-wave away at the power amplifiers 312 and 314, if the lines are of equal impedance, creating the same conditions as in the series connection of FIG. 3. If the transmission lines are of different impedance 201, 202, the power amplifier output currents I1 and I2 are forced to be scaled in the inverse ratio of the impedances.

The power amplifiers ideally each generate an output swing of Vcc at their ends of their quarter wave lines. Since the voltages are the same at that end, the currents at the other end one quarter wave away should be equal with equal lines. With unequal line impedances, the currents will be respectively Vcc/Zo1 and Vcc/Zo2 at the junction of the lines. The total output current is thus Io=Vcc(1/Zo1+1/Zo2) or 2Vcc/Zo for equal lines.

If the power amplifiers generate relatively phased currents Vcc·EXP(jα) and Vcc·EXP(−jα), then the total output current is:

$$Io = VCC \left( \frac{\text{EXP}(j\alpha)}{Zo} + \frac{\text{EXP}(-j\alpha)}{Zo} \right)$$
$$= 2Vcc \cdot \text{Cos}(\alpha)/Zo,$$

assuming equal impedance Zo lines.

The voltage Vo is thus given by:

$$Io \cdot R_L = \frac{2VCC \cdot R_L \text{Cos}(\alpha)}{Zo}.$$

This in turn forces the power amplifier currents to be:

$$\frac{2Vcc \cdot R_L \text{Cos}(\alpha)}{Zo^2},$$

showing that the peak current in each power amplifier may be reduced by Cos(α), which may not occur in the case of hybrid coupling. When α=90 degrees, the power amplifiers are antiphased, the output signals Vo, Io are zero, but so is the power amplifier current even though they are still driven to full Vcc output swing. It is as if the load impedance had been increased to infinity. Thus, by modulating α (in the DSP code), the effective load impedance seen by the power amplifiers is also modulated so that they generate only the instantaneously desired output power.

To obtain maximum efficiency, it is desirable to avoid harmonic currents flowing in the power amplifier output circuits. This may be obtained using a series resonant circuit in series with the power amplifier output terminal to present a low impedance to the fundamental and a high impedance to harmonics. However, a single shunt resonant circuit 550 may instead be connected one quarter wave away at the node of the two quarter wave lines, as shown in amplifier 500 of FIG. 5. The shunt resonator forces the voltage waveform to be sinusoidal at the junction of the lines (node 440), and therefore one quarter wave away the current at the power amplifier devices is forced to be sinusoidal.

Figure 6:
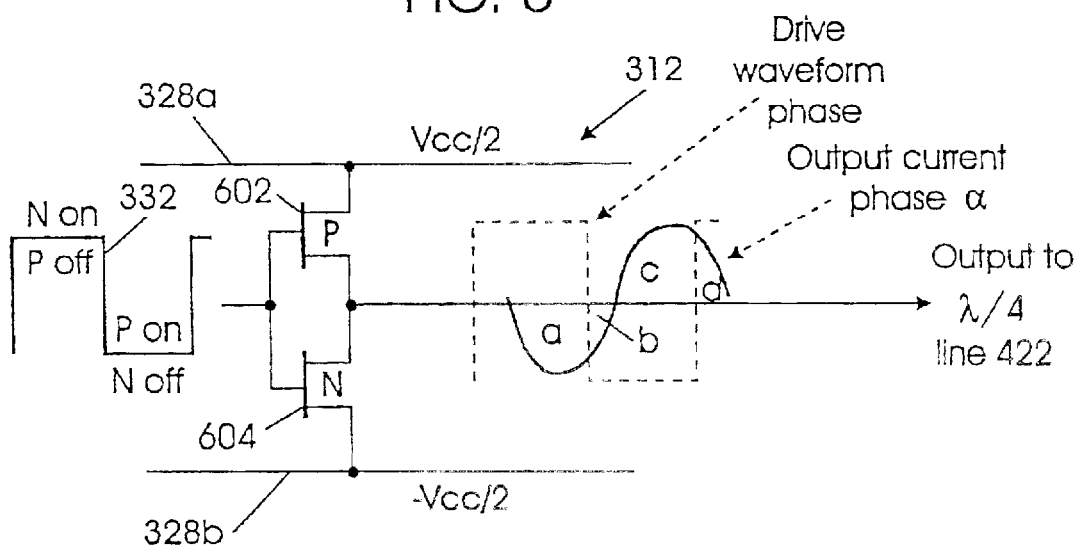
FIG. 6 is a circuit diagram of current and voltage relations in a power amplifier that uses bilateral devices.

As described above, the first and second amplifiers 312 and 314 respectively preferably include bilateral amplifier devices that draw current from the DC power supply 326 and supply current to the DC power supply. Accordingly, during part of the signal cycle of the AC input signal 332, current flows from the first and second amplifiers to the DC power supply to return energy to the DC power supply. FIG. 6 illustrates a power amplifier including bilateral amplifier devices according to the parent application.

As shown in FIG. 6, power amplifier 312 includes a P-type field effect transistor 602 and an N-type field effect transistor 604 that are respectively coupled between positive and negative power supplies 328a and 328b respectively. Input signal 332 is coupled to the P-type field effect transistor 602 and the N-type field effect transistor 604. These field effect transistors produce an output signal that is provided to the quarter wavelength line 422. Similar considerations apply to second amplifier 314.

When α is between 0 and 90 degrees, the sinusoidal current in the power amplifier devices is not in phase with the switching of the devices on and off, as illustrated in FIG. 6. As also shown in FIG. 6, the mean current from the power supplies is reduced by a further factor of cos(α) relative to the peak current Ipk. Since Ipk also reduces with cos(α), the net supply current reduces as $\cos^2(\alpha)$, which is the same factor by which the output power is reduced by modulating α. The supply power and load power both therefore track, maintaining the same theoretical efficiency when backed off as when not. This relies on the use of bilateral power amplifier devices which can pass current in the reverse direction during part of the input signal cycle, returning energy to the battery.

That the theoretical efficiency using ideal bilateral devices is 100% may be understood in the context of a single ended push-pull output stage, as shown in FIG. 6. In region "a" from 0 to (π–α), the current flows from –Vcc/2 to the load, while the N-type device is on, pulling down. This is delivering energy from –Vcc/2 source 328b to the load. In region "b", current is still negative, but the P-type device is on. That means current and energy are flowing back towards the +Vcc/2 source 328a. In region "c", current is flowing from the Vcc/2 328a source to the load while the P-type device is on, and in region "d", current is still negative when the N-type device comes on, sending current and energy back to the –Vcc/2 source 328b. The mean currents are thus:

$$\frac{Ipk}{2\pi}\left[\int_0^{\pi-\alpha}\sin(\theta)\delta\theta - \int_0^{\alpha}\sin(\theta)\delta\theta\right] = I_{pk}\cos(\alpha)/\pi$$

from each of the –Vcc/2 and +Vcc/2 supplies, that is reduced by the factor cos(α) compared to an in-phase current.

In FIG. 6, the mean supply currents from the split supplies –Vcc/2 and +Vcc/2 are computed to be Ipk/π when α=0. The total power from both supplies is therefore:

$$Ipk \cdot Vcc/\pi \qquad (1)$$

Figure 5:
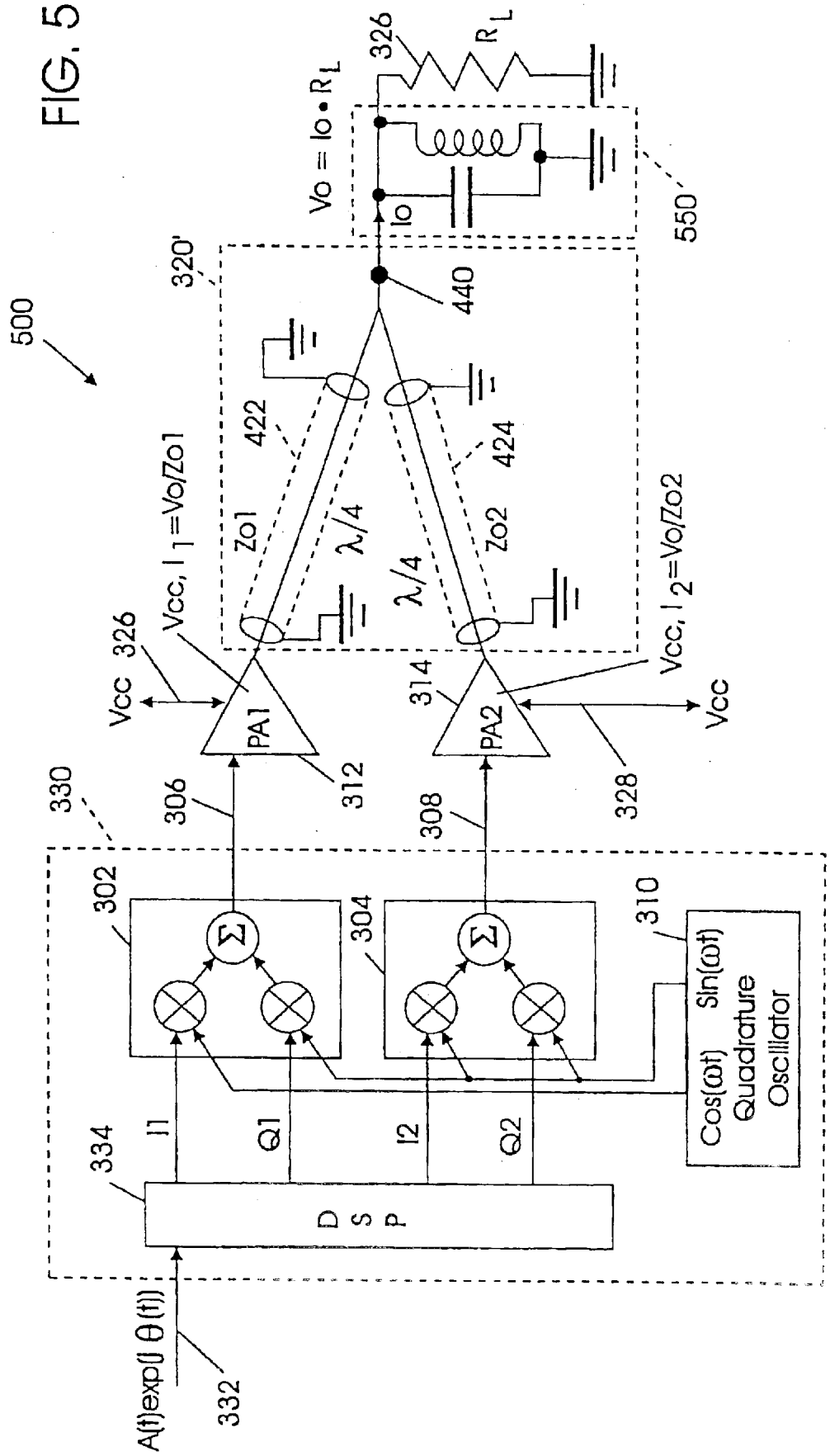
FIG. 5 is a block diagram of a third embodiment of power amplifiers according to the parent applications.

The square-wave voltage swing at the single-ended power amplifier output is –Vcc/2 to I–Vcc/2 i.e. Vcc/2 peak, so the current at the end of a quarter wave line of impedance Zo must be a square wave of peak current +/–Vcc/2Zo. The fundamental component of a square wave is 4/π times the peak, so the fundamental current driving the resonator of FIG. 5 is:

$$\frac{2Vcc}{\pi \cdot Zo}\text{peak.} \qquad (2)$$

The current induces a peak load voltage of:

$$\frac{2Vcc \cdot R_L}{\pi \cdot Zo}. \qquad (3)$$

The load power is thus ½×peak current×peak voltage:

$$= \frac{2Vcc^2 \cdot R_L}{(\pi \cdot Zo)^2}. \qquad (4)$$

Equation (3) gives the sinusoidal voltage swing on the resonator at the end of the quarter wave line. Thus, the current at the power amplifier device end of the line is this divided by Zo, i.e.:

$$Ipk = \frac{2Vcc \cdot R_L}{\pi \cdot Zo^2}. \qquad (5)$$

Substituting for Ipk from equation (5) into equation (1) gives the total DC input power as:

$$= \frac{2Vcc^2 \cdot R_L}{(\pi \cdot Zo)^2} \qquad (6)$$

which is the same as equation (4), showing that the efficiency is 100%.

It is well known that a switch-mode inverter with lossless filtering to convert a square-wave to a sine-wave output gives theoretical 100% efficiency. However, in the arrangement of FIGS. 3 to 6, which is encapsulated in the power amplifier of FIG. 7, the efficiency is maintained even for signals of varying amplitude, or when the transmitter is backed off to less than full output. In FIG. 7, amplifier 700 can use switch-mode (class-D) power amplifiers. The load 326 can be an antenna. Thus, the present invention, which has no theoretical limitations to efficiency, is a better starting point than prior art power amplifiers, the theoretical efficiency of which is already less than 100% even with ideal devices.

The parent applications use means, such as a digital signal processor (DSP) 334, to convert a complex modulation signal having a varying amplitude and a varying phase into two modulation signals having constant amplitude and differently varying phases. Means to produce two signals modulated by respective phase modulation signals are then employed. One means has been illustrated in FIG. 2, namely the use of two quadrature modulators 302, 304 driven respectively by the cosine and sine of their respective phase modulation signals. Another technique is shown in FIG. 8 wherein two frequency synthesizers, each modulatable in phase, such as modulatable fractional-N synthesizers 802 and 804 are used. A modulatable fractional-N synthesizer comprises an accumulator whose value determines the phase of an oscillator 812, 814 controlled by the synthesizer. Normally in a fractional-N synthesizer, the accumulator augments continuously (with wraparound) by the repeated addition of a slope value, which provides a frequency offset. To change the phase, the accumulator may be additionally augmented by adding once only a value equal to the change of phase desired. This arrangement is shown in FIG. 8.

Using two separate fractional-N synthesizers 802, 804, the cumulative nature of the delta-phase values added may get out of step. In practice therefore, the need to maintain synchronism suggests that the two synthesizers should be combined into a single chip. Moreover, the type of synthesizer called a "reciprocal fractional-N" disclosed by the present inventor in U.S. application Ser. No. 08/957,173, filed Oct. 24, 1997, entitled Digital Frequency Synthesis by Sequential Fraction Approximations, assigned to the assignee of the present application, the disclosure of which is hereby incorporated herein by reference, may be advantageous, as it modulates the reference divider controlled by a fixed reference frequency, which is then easier to synchronize when two modulated synthesizers are required.

Another directly phase-modulatable synthesizer technique is the Direct Digital Synthesizer or DDS, in which an accumulator computes the value of $(\omega + \phi)$ continuously and converts the most significant part to a sine wave using a sine look-up table. Any other conventional method of producing phase modulated signals can also be used with the parent applications.

Antenna Coupling Systems and Methods for Transmitters

Antenna coupling systems and methods for transmitters according to the present invention now will be described. An overview first will be provided. Then, a detailed description using FIGS. 9–10 will be provided.

Transmitters and transmitting methods according to the present invention transmit from a common antenna at a plurality of radio frequencies, a plurality of radio channel frequency signals that are modulated with respective information modulation. A plurality of modulators are provided, a respective one of which corresponds to a respective one of the plurality of radio channel frequencies. Each modulator generates at least one constant amplitude, phase modulated drive signal at the corresponding radio channel frequency from the respective information modulation, such that the at least one constant amplitude, phase modulated drive signal corresponds to the information modulation for the corresponding radio frequency. At least one saturated power amplifier is provided for each of the at least one constant amplitude, phase modulated drive signal. The at least one saturated power amplifier is responsive to the corresponding constant amplitude, phase modulated drive signal, to produce a corresponding amplified output signal at an output thereof. Finally, a coupling network connects the outputs of the saturated power amplifiers in series to produce a combined signal that is applied to the common antenna. The common antenna thus radiates the plurality of radio channel frequency signals that are modulated with the respective information modulation.

Figure 9:
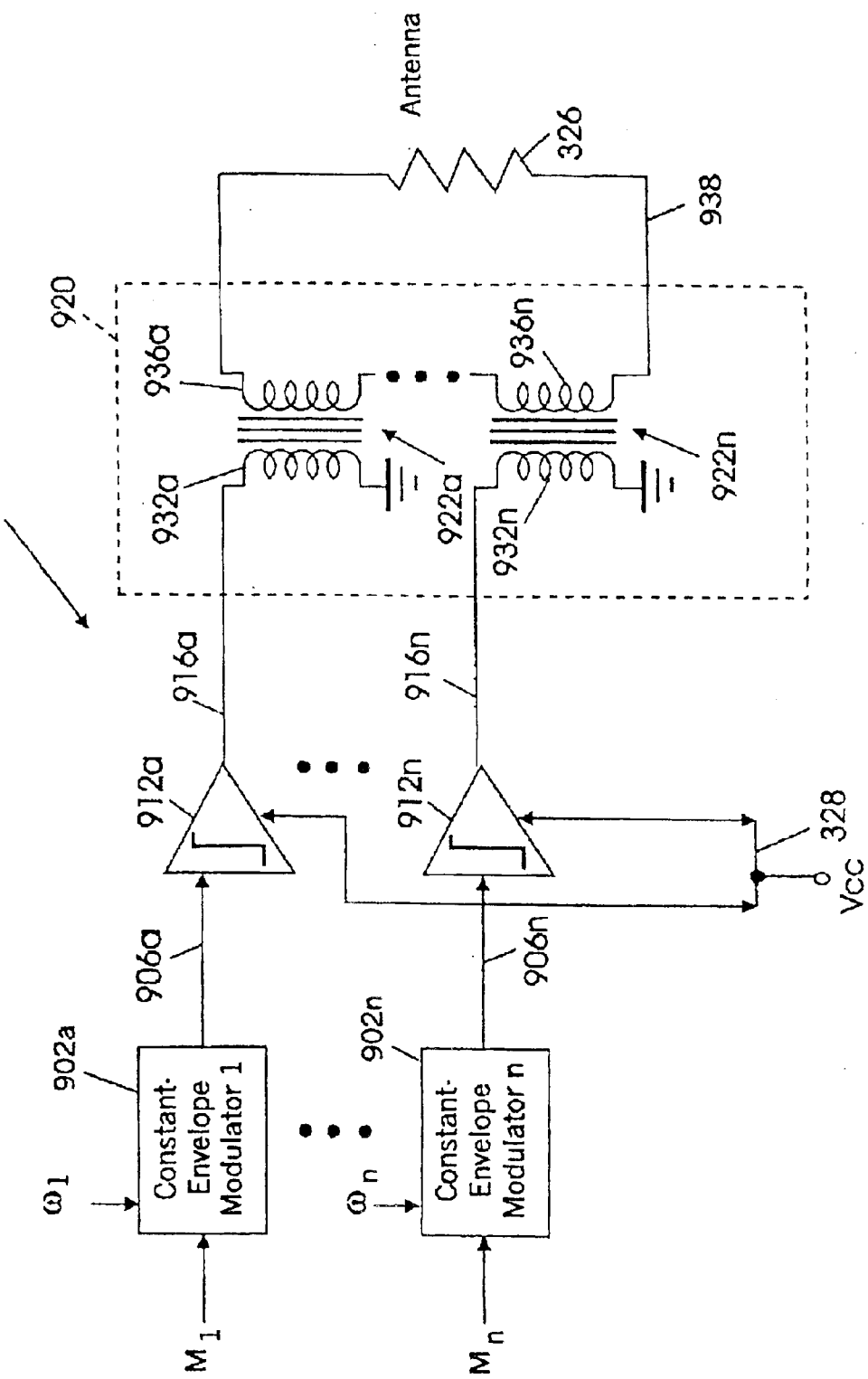
FIG. 9 is a block diagram of a first embodiment of transmitters according to the present invention.

Referring now to FIG. 9, first embodiments of transmitters and transmitting methods of the present invention will be described. As shown in FIG. 9, transmitters 900 employ a plurality of constant envelope modulators 902a . . . 902n, a respective one of which corresponds to a respective one of the plurality of radio channel frequencies $\omega_1 \ldots \omega_n$. Each modulator 902a . . . 902n generates a constant envelope modulation drive signal 906a . . . 906n at the corresponding radio channel frequency $\omega_1 \ldots \omega_n$ from the respective modulation information $M_1 \ldots M_n$.

Still referring to FIG. 9, a saturated power amplifier 912a . . . 912n is provided for each of the constant envelope modulation drive signals 906a . . . 906n, to produce a corresponding amplified output signal 916a . . . 916n at an output thereof. A coupling network 920 also is provided, that connects the outputs of the saturated power amplifiers 912a . . . 912n in series, to produce a combined signal 938 that is applied to the common antenna 326. The common antenna 326 therefore radiates the plurality of radio channel frequency signals that are modulated with the respective information modulation $M_1 \ldots M_n$.

As shown in FIG. 9, the coupling network 920 includes a plurality of transformers 922a . . . 922n, each having a primary 932a . . . 932n and a secondary 936a . . . 936n. A respective primary 932a . . . 932n is coupled to a respective output of a respective saturated power amplifier 912a. 912n. The secondaries 936a . . . 936n are serially connected to the common antenna 326. It will be understood that the coupling network 920 of FIG. 9 may be similar to the coupling network 320 of FIG. 3. Preferably, substantially the same current spectrum flows in the output power amplifier devices of all of the amplifiers 912a . . . 912n, due to the series connection. Each amplifier 912a . . . 912n preferably amplifies a signal at a different radio carrier frequency $\omega_1 \ldots \omega_n$, that is constant envelope-modulated with a different information modulation $M_1 \ldots M_n$.

Figure 10:
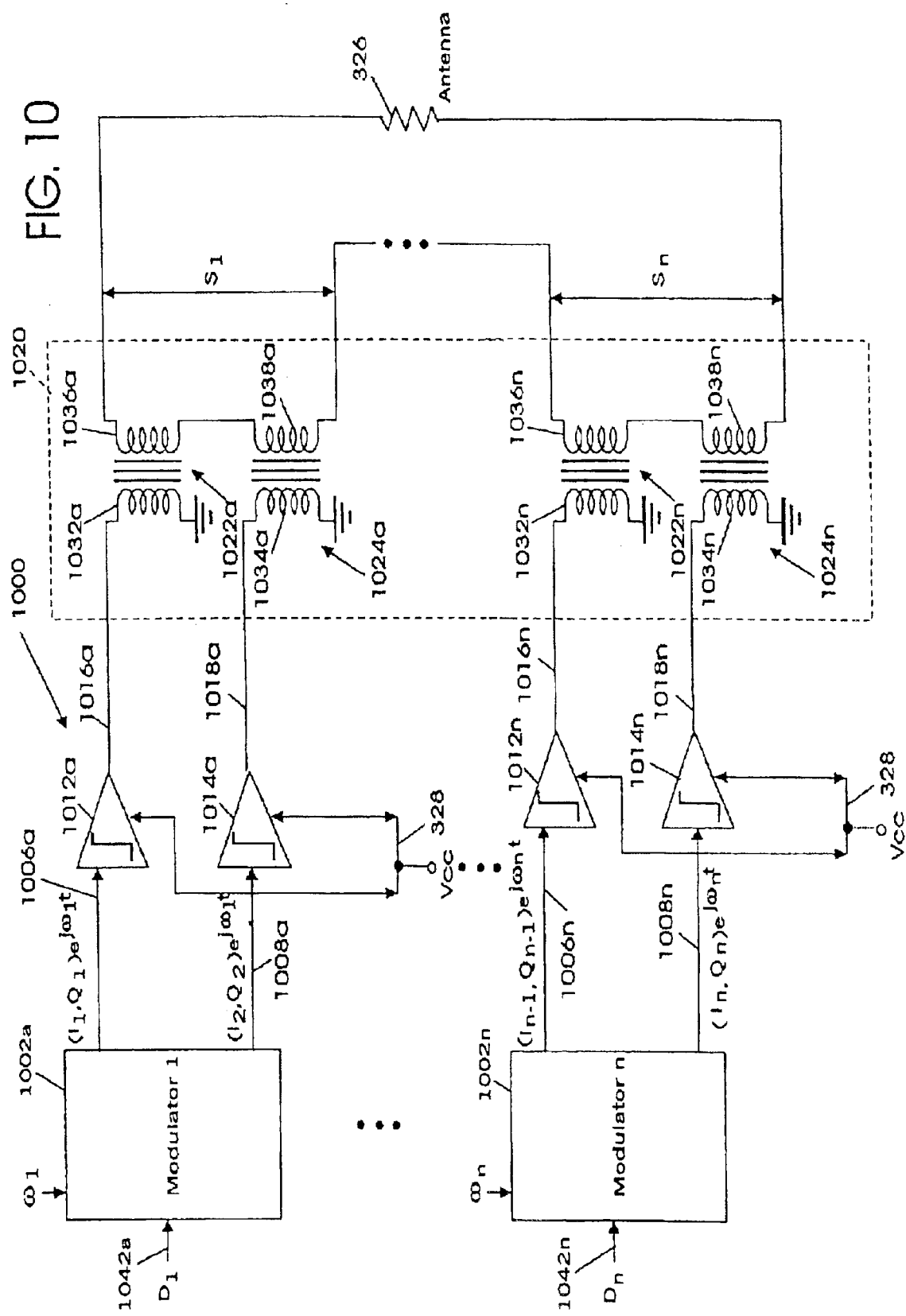
FIG. 10 is a block diagram of a second embodiment of transmitters according to the present invention.

Referring now to FIG. 10, a second embodiment of transmitters and transmitting methods according to the present invention will be described. In transmitters 1000, at least two saturated power amplifiers 1012a . . . 1012n and 1014a . . . 1014n are provided for each information modulation signal 1042a . . . 1042n. A modulator 1002a . . . 1002n modulates the corresponding information modulation 1042a . . . 1042n on a carrier frequency $\omega_1 \omega_n$, to produce at least two constant amplitude, phase modulated drive signals 1006a . . . 1006n and 1008a . . . 1008n, at the corresponding radio channel frequency $\omega_1 \ldots \omega_n$. Thus, the at least two constant amplitude, phase modulated drive signals 1006a . . . 1006n and 1008a . . . 1008n correspond to the information modulation for the corresponding radio frequency. The coupling network 1020 includes a first transformer 1022a . . . 1022n for each of the first saturated power amplifiers 1012a . . . 1012n, and a second transformer 1024a . . . 1024n for the second power amplifiers 1014a . . . 1014n. A respective primary 1032a . . . 1032n and 1034a . . . 1034n is coupled to a respective output 10162 . . . 1016n and 1018a . . . 1018n of a respective power amplifier 1012a . . . 1012n and 1014a . . . 1014n. The secondaries 1036a . . . 1036n and 1038a . . . 1038n are serially coupled to the common antenna 326.

Thus, in FIG. 10, the radio frequency power amplifiers are grouped to form groups of at least two power amplifiers 1012 and 1014 per group. Each power amplifier 1012 and 1014 in the same group amplifies a constant amplitude signal 1006, 1008 of the same radio carrier frequency $\omega$, but separately modulated in phase, such that the combination of the amplified signals produces a desired amplitude and phase modulated signal at a radio channel frequency $\omega$ that may be different for each group, modulated with an information stream 1042 that also may be different for each group.

As was described above, the amplifiers preferably employ bilateral power devices, such as field effect transistors that conduct from source to drain and from drain to source, and/or bipolar transistors including reverse conduction diodes that conduct in a forward direction through the bipolar transistors and in a reverse direction through the reverse conduction diodes. Thus, when the instantaneous current waveform value is of opposite sign to the instantaneous output voltage value of any amplifier, the current can effectively flow backwards through the device to the power supply. Losses in power conversion efficiency thereby can be reduced. This technique also can reduce intermodulation compared to the use of a multi-carrier (linear) amplifier for amplifying multiple signals jointly.

Other embodiments of coupling networks also may be used, as was already described. In particular, in FIGS. 9 and 10, the outputs of amplifiers 912, 1012 and 1014 are isolated (floated) using transformers, and the secondaries of the transformers are connected in series to one another and with the load impedance 326 (antenna). However, as was described above in connection with FIG. 4, the amplifier outputs may be connected via a quarter wavelength transmission line 422, 424, each having first and second ends. A respective first end is coupled to a respective output of a respective saturated power amplifier. The second ends are coupled together to a junction 440 that is coupled to the common antenna 326. As was described above in connection with FIG. 4, parallel connection at the common junction 440 can be equivalent to series connection one quarter wavelength away from the common junction 440. Other embodiments of coupling networks can use a plurality of discrete inductance-capacitance equivalents of quarter wavelength lines. Each discrete inductance-capacitance equivalent can comprise an inductor that is connected between a respective output of a respective saturated power amplifier and the common junction 440, and a capacitor connected to the common junction, to thereby form a $\pi$ circuit with the output capacitance of the saturated power amplifier. Harmonic filtering also may be provided as was described at FIG. 5, for example using a shunt resonance circuit 550.

The present invention can allow multi-coupling of transmitters operating on adjacent frequency channels, such as AMPS channels spaced only 30 kHz apart. Such coupling previously may have been difficult without using multi-couplers that were based on cooled, superconductive materials.

Further operational details of transmitters and transmitting methods according to the present invention now will be provided. First, transmitters and transmitting methods according to the present invention will be contrasted from those shown in FIG. 3. In FIG. 3, two power amplifiers 312 and 314 are coupled in series with the load 326. Each of the amplifiers is shown receiving a drive signal 316, 318, disclosed as a constant envelope drive signal of varying phase, produced by a respective quadrature modulator 302, 304 modulating complex baseband signal (I1, Q1) and (I2, Q2) respectively onto the radio carrier frequency signals cos(wt) and sin(wt). In FIG. 3, (I1, Q1) and (I2, Q2) preferably were each complex baseband signals with the property that $I1^2+Q1^2=I2^2=Q2^2=\text{CONSTANT}$.

The result of combining the two power amplifiers in series with the load was to produce a signal modulated in both amplitude and phase by a composite complex baseband signal (I1+I2, Q1+Q2), but still at the signal radio carrier frequency channel of frequency "$\omega$". In contrast, the present invention can use a block diagram similar to FIG. 3, to transmit separately modulated radio channel frequency signals on different channel frequencies $\omega_1 \ldots \omega_n$ via a common antenna. The efficiency loss inherent in the use of conventional combiners thereby may be reduced.

Thus, in FIG. 9, at least one of the quadrature modulators may be regarded as a single-sideband upconverter, and the associated (I, Q) modulating signal is then no longer a complex baseband signal, but rather a complex-modulated intermediate-frequency signal at a center frequency of $\omega_{IF}$ which is the difference frequency between the quadrature modulator local oscillator frequency "$\omega$" and the desired radio channel frequency. Each of the respective power amplifiers is driven with its own constant envelope modulated signal.

In a cellular wireless telephone base station of FIG. 9, each power amplifier can amplify a constant amplitude modulated cellular signal on a different radio frequency channel for transmission to respective portable wireless telephones. Examples of constant amplitude cellular telephone modulations are the analog Frequency Modulation of the U.S. AMPS system, or the Gaussian Minimum Shift Keying (GMSK) modulation of the digital cellular system known as GSM, which is a form of Continuous Phase Modulation or CPM. Other forms of CPM may be used. In FIG. 9, the number of different radio frequency channels $M_1 \ldots M_n$ that can be transmitted via the same antenna 326 generally is equal to one per power amplifier 912*a* . . . 912*n*.

Due to the series coupling of the amplifiers 912*a* . . . 912*n* with the load 326 (i.e. the antenna), the current in the load, which is the sum of currents at all the different radio frequencies, flows in each of the amplifier output circuits. The amplifiers 912*a* . . . 912*n* are preferably push-pull amplifiers, each using at least two bilateral amplifier devices that, for example, alternately connect the output terminal of the amplifier to a positive and a negative DC power source, the alternation preferably occurring at the radio channel frequency as determined by the input drive signal. Since the current in the output device is the sum of many signals at different channel frequencies, the net current can be negative at a time that a particular amplifier is connecting its output terminal to the positive supply, so that current flows backwards through the device to the positive supply. Likewise the net current can be positive at a time a particular amplifier has connected its output terminal to the negative supply, thus returning current and energy to the negative supply. The principle of allowing current and thus energy to be returned to the supply when the instantaneous direction of the net current is opposite to that of the particular signal amplified by the particular amplifier, can reduce the efficiency loss that generally is incurred in linear, multicarrier amplifiers operated with back-off to avoid unwanted intermodulation. This principle also can avoid intermodulation, as the net output current generally is linearly proportional to the net sum of the separately modulated signals.

A first constant envelope modulator (902*a*) has an input for a first modulating signal, such as a voice or digital data signal $M_1$, and an input for determining the radio channel frequency $\omega_1$. Modulator 902*a* produces a constant envelope output signal 906*a* which is connected to drive the input of the saturated amplifier 912*a*.

The combination of a modulator 902 and a saturated amplifier 912 is repeated 'n' times, where 'n' preferably is the number of radio channels to be modulated with information streams. The last modulator is block 902*n* and the last transmit power amplifier is block 912*n*. The outputs of the 'n' power amplifiers 916*a* . . . 916*n* are effectively connected in series, for example by the use of the illustrated transformers 922*a* . . . 922*n*. These transformers have a primary winding 932*a* . . . 932*n* connected to the respective amplifier output 916*a* . . . 916*n* and a secondary winding 936*a* . . . 936*n*. The secondary windings are connected in series and with the load impedance 326, thus ensuring that the sum of the amplifier output voltages is applied to the load 326. The load current thus is equal to the sum voltage divided by the load impedance. The load impedance preferably is high at harmonics of the radio frequency band, which can be enhanced by the use of a harmonic suppression filter (FIG. 5) to avoid radiation of unwanted harmonics. The load impedance at the fundamental frequencies of the desired radio channels preferably is real, i.e. purely resistive, and not reactive. Unlike prior art amplifiers, the present invention can be largely immune to load impedance mismatch at the fundamental frequency of operation. This mismatch may have the effect of modifying the amount of power generated at the desired frequency, but need not impair linearity and efficiency.

As was previously disclosed in the parent applications, the transformer series coupling of FIG. 9 can be replaced by a parallel connection one quarter of a wavelength away from the amplifier using suitable quarter wave transmission lines or their discrete inductor-capacitor (L-C) equivalents. A C-L-C π-circuit, for example, can be arranged to be equivalent to a quarter wave line, the "C" at one end absorbing the power amplifier device output capacitance and the sum of the C's at the parallel-connected end being combined into a single capacitor.

Embodiments of FIG. 9 have been described above to be suitable for transmitting 'n' constant envelope-modulated signals from the same antenna, such as may be desired in AMPS or GSM cellular telephone base stations. Cellular base stations using other standards may employ non-constant-amplitude, or "linear" modulation, where the desired transmission signal varies in both phase and amplitude, in order better to contain spectral spillover into adjacent channels. For example, the U.S. digital cellular standard known as DAMPS or IS136 uses a linear modulation called π/4-DQPSK. In the AMPS and DAMPS standards, and also in GSM, it may not be necessary to couple adjacent channel transmitters to the same antenna. Indeed, this may have been difficult as conventional techniques to couple multiple transmitters to the same antenna generally used either dissipative combiners that may waste most of the transmitter power as heat, or frequency-selective combiners, which generally were not sufficiently frequency-selective to combine adjacent channels unless constructed using cooled, superconductive resonators. Therefore frequency assignment plans were commonly used which avoided using adjacent channels in the same cell, as well as avoiding using the same channel in adjacent cells, thus avoiding interference between neighboring cells.

Advances in signal processing have, however, improved the ability to use the same channel in adjacent cells, and thus all channels can be theoretically used in all cells, with consequent increases in system capacity. One such technique that uses the same channel in all cells, albeit with debatable capacity improvements, is the first generation CDMA system known as IS95. One of the difficulties of using all frequency channels in all cells is the antenna multicoupling problem, one solution for which was disclosed in U.S. Pat. No. 5,584,057 to the present inventor, entitled Use of Diversity Transmission to Relax Adjacent Channel Requirements in Mobile Telephone Systems, assigned to the assignee of the present invention, the disclosure of which is hereby incorporated by reference herein. This patent describes coupling even channels to a first antenna and odd channels to a second antenna in the same cell, thus doubling the frequency spacing of the channels coupled to the same antenna. For 30 kHz channel spacing as used in AMPS and DAMPS however, doubling the channel spacing may be insufficient to permit efficient multicoupling using conventional combiners. Therefore, despite advances in signal processing such as interference cancellation and/or joint demodulation techniques, which can allow much closer re-use of the same frequency channel, the advantages may be constrained by the inability to efficiently couple adjacent channels to the same antenna.

This problem also can arise in the context of GSM-type systems constructed using a limited amount of spectrum, such as only three, 200 kHz wide channels, which also may be limited in the type of frequency assignments that can be considered using conventional antenna multicouplers. Moreover, future evolution of GSM to transmit higher data rates, which enhancement is called "EDGE", includes use of a non-constant envelope 8-PSK modulation. Thus, the second embodiments of the invention as described in FIG. 10 may be adapted for systems such as IS95, GSM/EDGE and DAMPS which employ linear, non-constant-amplitude modulation waveforms. EDGE employs a linear, 8-phase signal (8-PSK) where the term "linear" implies that the transitions between successive 8-PSK symbols does not follow a constant amplitude trajectory but rather a spectral band limited trajectory. Other well-known modulations that use both amplitude and phase to convey information are multi-level Quadrature Amplitude modulations such as 16QAM, 64QAM, 256QAM and so on.

The second embodiment shown in FIG. 10 effectively comprises multiple amplifier groups, each amplifier group comprising at least two, coupled, constant envelope amplifiers $1012a \ldots 1012n$ and $1014a \ldots 1014n$, and each amplifier group operating on its own carrier frequency $\omega_1 - \omega_n$. All amplifiers are then connected in series at their outputs.

FIG. 10 may be regarded as showing a first linear transmitter comprising a modulator 1002, a pair of amplifiers 1012 and 1014 and a pair of transformers 1022 and 1024 having an input of a data signal for transmission D1 and a modulated and amplified output signal S which is centered on a radio carrier frequency $\omega$. The linear amplifier may be repeated n times. The output signals of all 'n' blocks are connected in series, and with the load 326 so that the load receives the sum of the respective output signals S1+S2+S3 . . . +Sn.

A respective modulator 1002, to which the respective data signal is input, produces drive signals for each of a group of at least two amplifiers 1012 and 1014, the outputs of which are effectively connected in series as illustrated by the use of transformers 1022 and 1024. The drive signals for all amplifiers produced by the modulators preferably are constant envelope drive signals that differ only in phase, the phase differences being chosen such that the resultant sum has both a desired instantaneous phase and a desired instantaneous amplitude. Modulator 1 1002a, for example, produces a constant envelope signal $(I1,Q1)\exp(j\omega_1 t)$ and a second constant envelope signal $(I2,Q2)\exp(j\omega_1 t)$ so that the resultant sum $(I1+I2,Q1+Q2)\exp(j\omega_1)$ is the desired amplitude-and-phase modulated signal at the carrier frequency $\omega 1$. Another modulator, for example modulator 'n' 1002n, produces from Dn another two constant envelope signals $(I_{n-1},Q_{n-1})\exp(j\omega_n t)$ and $(I_n,Q_n)\exp(j\omega_n t)$ whose sum $(I_{n-1}+I_n,Q_{n-1}+Q_n)\exp(j\omega_n t)$ is the desired modulated signal at carrier frequency $\omega_n$.

In the parent applications, it was shown that an improvement to the generation of linearly modulated signals by combining constant envelope signals may be achieved when the number of combined signals is greater than two, and a particularly simple case is to combine four signals. Thus each one of the transmitters of FIG. 10 may comprise such a transmitter, characterized by combining at least two constant envelope signals and preferably by combining four constant envelope signals.

In conclusion, the present invention can extend the efficiency advantages of series-coupled transmitter power amplifier configurations to applications that use several transmitters operating on different radio channels to share the same antenna, such as a radiotelephone base station. Other single-carrier transmitters may be combined using the present invention to produce a multi-carrier transmitter, such as the quadrature power digital-to-analog converter techniques of U.S. patent application Ser. No. 09/208,912, filed Dec. 10, 1998 entitled Systems and Methods for Converting a Stream of Complex Numbers Into a Modulated Radio Power Signal to the present inventor et al.; and U.S. patent application Ser. No. 09/216,466, filed Dec. 18, 1998 entitled Systems and Methods for Converting a Stream of Complex Numbers Into An Amplitude and Phase-Modulated Radio Power Signal to Holden et al., both of which are assigned to the assignee of the present invention, the disclosures of both of which are hereby incorporated by reference herein.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A transmitter that transits from a common antenna at a plurality of radio frequencies, a plurality of radio channel frequency signals that are modulated with respective information modulation, the transmitter comprising:

a plurality of modulators, a respective one of which corresponds to a respective one of the plurality of radio channel frequencies, each modulator generating at least one constant amplitude, phase modulated drive signal at the corresponding radio channel frequency from the respective information modulation such that the at least one constant amplitude, phase modulated drive signal corresponds to the information modulation for the corresponding radio frequency;

at least one saturated power amplifier for each of the at least one constant amplitude, phase modulated drive signal that is responsive to the corresponding constant amplitude, phase modulated drive sigal to produce a corresponding amplified output signal at an output thereof; and a coupling network that connects the outputs of the saturated power amplifiers in series to produce a combined signal that is applied to the common antenna, such that the common antenna radiates the plurality of radio channel frequency signals that are modulated with the respective information modulation.

2. A transmitter according to claim 1 wherein the at least one constant amplitude, phase modulated drive signal is a single constant envelope modulation drive signal and wherein the information modulation is a constant envelope information modulation.

3. A transmitter according to claim 2 wherein the constant envelope information modulation is at least one of frequency and phase modulation.

4. A transmitter according to claim 2 wherein the information modulation is at least one of analog voice modulation and digital data modulation.

5. A transmitter according to claim 4 wherein the analog voice modulation is analog Frequency Modulation (FM).

6. A transmitter according to claim 4 wherein the digital data modulation is at least one of Continuous Phase Modulation (CPM) and Gaussian Minimum Shift Keying (GMSK).

7. A transmitter according to claim 5 wherein the analog FM conforms to the AMPS cellular radiotelephone standard.

8. A transmitter according to claim 6 wherein the GMSK digital data modulation conforms to the GSM cellular radiotelephone standard.

9. A transmitter according to claim 1 wherein the at least one constant amplitude, phase modulated drive signal is at least two constant amplitude, phase modulated drive signals at the corresponding radio channel frequency, such that the at least two constant amplitude, phase modulated drive signals correspond to the information modulation for the corresponding radio frequency.

10. A transmitter according to claim 9 wherein the information modulation is at least one of analog voice modulation and digital data modulation.

11. A transmitter according to claim 10 wherein the digital data modulation is at least one of linear 8-Phase Shift Keying (PSK) and π/4 Differential Quadrature Phase Shift Keying (DQPSK).

12. A transmitter according to claim 11 wherein the DQPSK conforms to at least one of the IS-136 and DAMPS cellular radiotelephone standards.

13. A transmitter according to claim 1 wherein the coupling network comprises a plurality of transformers, each having a primary and a secondary, a respective primary being coupled to a respective output of a respective saturated power amplifier, the secondaries being serially coupled to the common antenna.

14. A transmitter according to claim 1 wherein the coupling network comprises a plurality of quarter wavelength transmission lines each having first and second ends, a respective first end being coupled to a respective output of a respective saturated power amplifier, the second ends being coupled together to the common antenna.

15. A transmitter according to claim 1 wherein the coupling network comprises a plurality of discrete inductance-capacitance equivalents of quarter wavelength transmission lines each having first and second ends, a respective first end being coupled to a respective output of a respective saturated power amplifier, the second ends being coupled together to the common antenna.

16. A transmitter according to claim 15 wherein the plurality of discrete inductance-capacitance equivalents of quarter wavelength transmission lines each comprises an inductor connected between a respective output of a respective saturated power amplifier and the common antenna, and a capacitor connected to the common antenna, to thereby form a π circuit with the output capacitance of the saturated power amplifiers.

17. A transmitter according to claim 1 wherein the saturated power amplifiers each include bilateral amplifier devices that draw current from a DC power supply and supply current to the DC power supply during operation.

18. A transmitter according to claim 17 wherein the bilateral amplifier devices comprise at least one of field effect transistors that conduct from source to drain and from drain to source, and bipolar transistors including reverse conduction diodes that conduct in a forward direction through the bipolar transistors and in a reverse direction through the reverse conduction diodes.

19. A transmitter according to claim 1 in combination with the common antenna to provide a radiotelephone base station.

20. A transmitter for transmitting from a common antenna at a plurality of radio frequencies, a plurality of radio channel frequency signals that are modulated with respective information modulation, the transmitter comprising:

means for generating at least one constant amplitude, phase modulated drive signal at a corresponding radio channel frequency from the respective information modulation such that the at least one constant amplitude, phase modulated drive signal corresponds to the information modulation for the corresponding radio frequency;

means for separately saturably amplifying each of the at least one constant amplitude, phase modulated drive signals to produce a corresponding plurality of amplified output signals; and means for serially coupling the plurality of amplified output signals to produce a combined signal that is applied to the common antenna, such that the common antenna radiates the plurality of radio channel frequency signals that are modulated with the respective information modulation.

21. A transmitter according to claim 20 wherein the at least one constant amplitude, phase modulated drive signal is a single constant envelope modulation drive signal and wherein the information modulation is a constant envelope information modulation.

22. A transmitter according to claim 21 wherein the constant envelope information modulation is at least one of frequency and phase modulation.

23. A transmitter according to claim 21 wherein the information modulation is at least one of analog voice modulation and digital data modulation.

24. A transmitter according to claim 23 wherein the analog voice modulation is analog Frequency Modulation (FM).

25. A transmitter according to claim 23 wherein the digital data modulation is at least one of Continuous Phase Modulation (CPM) and Gaussian Minimum Shift Keying (GMSK).

26. A transmitter according to claim 24 wherein the analog FM conforms to the AMPS cellular radiotelephone standard.

27. A transmitter according to claim 26 wherein the GMSK digital data modulation conforms to the GSM cellular radiotelephone standard.

28. A transmitter according to claim 20 wherein the at least one constant amplitude, phase modulated drive signal is at least two constant amplitude, phase modulated drive signals at the corresponding radio channel frequency, such that the at least two constant amplitude, phase modulated drive signals correspond to the information modulation for the corresponding radio frequency.

29. A transmitter according to claim 28 wherein the information modulation is at least one of analog voice modulation and digital data modulation.

30. A transmitter according to claim 29 wherein the digital data modulation is at least one of linear 8-Phase Shift Keying (PSK) and π/4 Differential Quadrature Phase Shift Keying (DQPSK).

31. A transmitter according to claim 30 wherein the DQPSK conforms to at least one of the IS-136 and DAMPS cellular radiotelephone standards.

32. A transmitter according to claim 20 wherein the means for serially coupling comprises a plurality of transformers, each having a primary and a secondary, a respective primary being coupled to a respective amplified output sigal, the secondaries being serially coupled to the common antenna.

33. A transmitter according to claim 20 wherein means for serially coupling comprises a plurality of quarter wavelength transmission lines each having first and second ends, a respective first end being coupled to a respective amplified output signal, the second ends being coupled together to the common antenna.

34. A transmitter according to claim 20 wherein the means for serially coupling comprises a plurality of discrete inductance-capacitance equivalents of quarter wavelength transmission lines each having first and second ends, a respective first end being coupled to a respective amplified output signal, the second ends being coupled together to the common antenna.

35. A transmitter according to claim 34 wherein the plurality of discrete inductance-capacitance equivalents of quarter wavelength transmission lines each comprises an inductor connected between a respective amplified output signal and the common antenna, and a capacitor connected to the common antenna, to thereby form a π circuit with the output capacitance of the means for separately amplifying.

36. A transmitter according to claim 20 wherein the means for separately amplifying includes bilateral amplifier devices that draw current from a DC power supply and supply current to the DC power supply during operation.

37. A transmitter according to claim 36 wherein the bilateral amplifier devices comprise at least one of field effect transistors that conduct from source to drain and from drain to source, and bipolar transistors including reverse conduction diodes that conduct in a forward direction through the bipolar transistors and in a reverse direction through the reverse conduction diodes.

38. A transmitter according to claim 20 in combination with the common antenna to provide a radiotelephone base station.

39. A method for transmitting from a common antenna at a plurality of radio frequencies, a plurality of radio channel frequency signals that are modulated with respective information modulation, the method comprising:

generating at least one constant amplitude, phase modulated drive signal at a corresponding radio channel frequency from the respective information modulation such that the at least one constant amplitude, phase modulated drive signal corresponds to the information modulation for the corresponding radio frequency;

separately saturably amplifying each of the at least one constant amplitude, phase modulated drive signals to produce a corresponding plurality of amplified output signals; and serially coupling the plurality of amplified output signals to produce a combined signal that is applied to the common antenna, such that the common antenna radiates the plurality of radio channel frequency signals that are modulated with the respective information modulation.

40. A method according to claim 39 wherein the at least one constant amplitude, phase modulated drive signal is a single constant envelope modulation drive signal and wherein the information modulation is a constant envelope information modulation.

41. A method according to claim 40 wherein the constant envelope information modulation is at least one of frequency and phase modulation.

42. A method according to claim 40 wherein the information modulation is at least one of analog voice modulation and digital data modulation.

43. A method according to claim 42 wherein the analog voice modulation is analog Frequency Modulation (FM).

44. A method according to claim 42 wherein the digital data modulation is at least one of Continuous Phase Modulation (CPM) and Gaussian Minimum Shift Keying (GMSK).

45. A method according to claim 43 wherein the analog FM conforms to the AMPS cellular radiotelephone standard.

46. A method according to claim 44 wherein the GMSK digital data modulation conforms to the GSM cellular radiotelephone standard.

47. A method according to claim 39 wherein the at least one constant amplitude, phase modulated drive signal is at least two constant amplitude, phase modulated drive signals at the corresponding radio channel frequency, such that the at least two constant amplitude, phase modulated drive signals correspond to the information modulation for the corresponding radio frequency.

48. A method according to claim 47 wherein the information modulation is at least one of analog voice modulation and digital data modulation.

49. A method according to claim 48 wherein the digital data modulation is at least one of linear 8-Phase Shift Keying (PSK) and π/4 Differential Quadrature Phase Shift Keying (DQPSK).

50. A method according to claim 49 wherein the DQPSK conforms to at least one of the IS-136 and DAMPS cellular radiotelephone standards.

* * * * *